United States Patent
Kim et al.

(10) Patent No.: US 12,178,100 B2
(45) Date of Patent: Dec. 24, 2024

(54) DISPLAY APPARATUS

(71) Applicant: SAMSUNG DISPLAY CO., LTD., Yongin-si (KR)

(72) Inventors: Kiwook Kim, Yongin-si (KR); Kwangmin Kim, Yongin-si (KR); Yangwan Kim, Yongin-si (KR); Jisu Na, Yongin-si (KR); Minwoo Byun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/519,742

(22) Filed: Nov. 27, 2023

(65) Prior Publication Data

US 2024/0090289 A1 Mar. 14, 2024

Related U.S. Application Data

(60) Continuation of application No. 17/728,474, filed on Apr. 25, 2022, now Pat. No. 11,832,485, which is a
(Continued)

(30) Foreign Application Priority Data

May 31, 2018 (KR) ........................ 10-2018-0062902

(51) Int. Cl.
*H01L 21/00* (2006.01)
*H10K 50/844* (2023.01)
(Continued)

(52) U.S. Cl.
CPC ......... *H10K 59/131* (2023.02); *H10K 50/844* (2023.02); *H10K 59/124* (2023.02)

(58) Field of Classification Search
CPC ... H10K 59/131; H10K 50/844; H10K 59/124
See application file for complete search history.

(56) References Cited

U.S. PATENT DOCUMENTS 6,373,453 B1 * 4/2002 Yudasaka ............. H10K 59/122
345/82
7,407,386 B1 * 8/2008 Ichikawa ............. H05K 3/3452
439/55
(Continued)

FOREIGN PATENT DOCUMENTS

CN 1242855 A 1/2000
CN 1992328 A 7/2007
(Continued)

OTHER PUBLICATIONS

Ex Parte Quayle Action Dated Jun. 25, 2020 Correponding to U.S. Appl. No. 16/375,063.
(Continued)

*Primary Examiner* — Laura M Menz
(74) *Attorney, Agent, or Firm* — F. Chau & Associates, LLC

(57) ABSTRACT

A display apparatus includes a substrate, a wire having an inner edge including first and second portions, a first insulating layer covering a portion of the substrate, and a second insulating layer. The portion of the substrate covered by the first insulating layer is closer to a center of the substrate than the wire, the first insulating layer covers a part of the first portion of the wire and a part of the second portion of the wire, and a first end of the first insulating layer is disposed on the wire. The second insulating layer covers the first insulating layer and has a second end disposed on the wire. A distance between the first end and the second end covering the first portion of the wire is different from a distance between the first end and the second end covering the second portion of the wire.

20 Claims, 10 Drawing Sheets

Related U.S. Application Data continuation of application No. 17/095,857, filed on Nov. 12, 2020, now Pat. No. 11,329,121, which is a division of application No. 16/375,063, filed on Apr. 4, 2019, now Pat. No. 10,868,101.

(51) Int. Cl.
*H10K 59/124* (2023.01)
*H10K 59/131* (2023.01)

(56) References Cited

U.S. PATENT DOCUMENTS

| | | | |
|---|---|---|---|
| 7,456,811 | B2 | 11/2008 | Kwak |
| 7,808,176 | B2 | 10/2010 | Sakaguchi et al. |
| 9,647,233 | B2 * | 5/2017 | Kim .................. H10K 50/8426 |
| 9,905,798 | B2 * | 2/2018 | Jang .................. H10K 59/8794 |
| 10,424,759 | B2 * | 9/2019 | Jang .................. H10K 59/124 |
| 10,591,780 | B2 * | 3/2020 | Li ........................ G02F 1/1339 |
| 10,797,084 | B2 * | 10/2020 | Lee ...................... H01L 27/124 |
| 10,797,252 | B2 * | 10/2020 | Choi .................. H10K 59/131 |
| 10,868,101 | B2 * | 12/2020 | Kim .................... H10K 59/179 |
| 11,107,793 | B2 * | 8/2021 | Yun ...................... H01L 25/0655 |
| 11,329,121 | B2 * | 5/2022 | Kim .................... H10K 59/131 |
| 11,476,297 | B2 * | 10/2022 | Lee .......................... H01L 23/08 |
| 11,487,169 | B2 * | 11/2022 | Xu ........................ G02F 1/1345 |
| 11,678,534 | B2 * | 6/2023 | Lee ...................... H10K 59/131 |
| | | | 257/40 |
| 11,785,833 | B2 * | 10/2023 | Park ........................ B32B 9/041 |
| | | | 257/40 |
| 11,832,485 | B2 * | 11/2023 | Kim .................... H10K 59/124 |
| 2002/0075207 | A1 | 6/2002 | Yudasaka |
| 2007/0153208 | A1 * | 7/2007 | Sakaguchi ........... H10K 59/871 |
| | | | 349/149 |
| 2008/0211081 | A1 | 9/2008 | Lee |
| 2011/0297942 | A1 | 12/2011 | Kim et al. |
| 2014/0004704 | A1 | 1/2014 | Hung et al. |
| 2015/0227235 | A1 | 8/2015 | Lee et al. |
| 2015/0340648 | A1 * | 11/2015 | Jang ........................ H10K 71/00 |
| | | | 438/23 |
| 2016/0148562 | A1 * | 5/2016 | Jung .................. H10K 59/8722 |
| | | | 345/212 |
| 2016/0268540 | A1 | 9/2016 | Kim et al. |
| 2016/0276422 | A1 * | 9/2016 | Kim .................... H10K 59/123 |
| 2016/0285038 | A1 | 9/2016 | Kim |
| 2017/0025066 | A1 * | 1/2017 | Pyon .................... G09G 3/3266 |
| 2017/0033102 | A1 * | 2/2017 | Kim .................... H01L 27/0207 |
| 2017/0033312 | A1 * | 2/2017 | Kim .................... H10K 59/873 |
| 2017/0317299 | A1 | 11/2017 | Choi et al. |
| 2018/0159073 | A1 * | 6/2018 | Jang .................. H10K 50/8426 |
| 2018/0205037 | A1 | 7/2018 | Kim et al. |
| 2018/0307355 | A1 | 10/2018 | Kim et al. |
| 2019/0109156 | A1 * | 4/2019 | Lee ...................... H01L 27/1218 |
| 2019/0280225 | A1 * | 9/2019 | Choi .................. H10K 59/131 |
| 2019/0326369 | A1 * | 10/2019 | Lv ........................ H10K 50/813 |
| 2019/0355930 | A1 * | 11/2019 | Lee ...................... H10K 50/844 |
| 2019/0371876 | A1 * | 12/2019 | Kim .................... H10K 59/124 |
| 2020/0020273 | A1 * | 1/2020 | Hong ...................... G09G 3/32 |
| 2020/0044193 | A1 * | 2/2020 | Kim ...................... H10K 59/873 |
| 2020/0105664 | A1 * | 4/2020 | Han ...................... H01L 23/5226 |
| 2021/0028380 | A1 * | 1/2021 | Choi .................... H10K 50/844 |
| 2021/0083039 | A1 * | 3/2021 | Kim ...................... H10K 59/173 |
| 2021/0193779 | A1 * | 6/2021 | Lee ...................... H10K 59/131 |
| 2022/0085308 | A1 * | 3/2022 | Park .......................... B32B 3/04 |
| 2022/0165988 | A1 * | 5/2022 | Kim .................... H10K 59/131 |
| 2022/0246713 | A1 * | 8/2022 | Kim .................... H10K 59/173 |
| 2023/0225181 | A1 * | 7/2023 | Choi .................. H10K 59/1213 |
| | | | 257/40 |
| 2023/0343692 | A1 * | 10/2023 | Hsieh ...................... H01L 24/16 |
| 2024/0090289 | A1 * | 3/2024 | Kim .................... H10K 59/179 |
| 2024/0105540 | A1 * | 3/2024 | Jung .................. G02F 1/133562 |
| 2024/0177673 | A1 * | 5/2024 | Kim ...................... G09G 3/3266 |

FOREIGN PATENT DOCUMENTS

| | | | | |
|---|---|---|---|---|
| CN | 101764130 | | 6/2010 | |
| CN | 101764130 B | * | 12/2013 | ......... H01L 21/0337 |
| CN | 105633298 A | | 6/2016 | |
| CN | 105957874 A | | 9/2016 | |
| CN | 110556385 | | 12/2019 | |
| CN | 110556385 A | * | 12/2019 | ......... H01L 27/1218 |
| EP | 0940796 | | 9/1999 | |
| EP | 3416194 | | 12/2018 | |
| EP | 3416194 A1 | * | 12/2018 | ......... H01L 27/1218 |
| EP | 3579278 | | 12/2019 | |
| EP | 3579278 A1 | * | 12/2019 | ......... H01L 27/1218 |
| EP | 3579278 B1 | * | 4/2024 | ......... H01L 27/1218 |
| JP | 2012226368 | | 11/2012 | |
| JP | 2012226368 A | * | 11/2012 | ....... G02F 1/134309 |
| JP | 7181687 | | 12/2022 | |
| JP | 7181687 B2 | * | 12/2022 | ........... H01L 27/124 |
| KR | 10-2000-0068764 | | 11/2000 | |
| KR | 10-2011-0132819 | | 12/2011 | |
| KR | 10-2015-0016784 | | 2/2015 | |
| KR | 10-2015-0049640 | | 5/2015 | |
| KR | 10-2016-0063483 | | 6/2016 | |
| KR | 10-2016-0110598 | | 9/2016 | |
| KR | 10-2016-0116240 | | 10/2016 | |
| KR | 10-2017-0015629 | | 2/2017 | |
| KR | 10-2017-0071816 | | 6/2017 | |
| KR | 10-2017-0090382 | | 8/2017 | |
| WO | 2014092041 | | 6/2014 | |

OTHER PUBLICATIONS

Extended European Search Report Dated Nov. 12, 2019 in Corresponding European Patent Application No. 19175774.9.
Notice of Allowance Dated Jan. 12, 2022 in Corresponding U.S. Appl. No. 17/095,857.
Notice of Allowance Dated Aug. 24, 2020 Corresponding to U.S. Appl. No. 16/375,063.
Notice of Allowance dated Jul. 24, 2023 in corresponding U.S. Appl. No. 17/728,474.
Office Action dated Apr. 27, 2023 in corresponding U.S. Appl. No. 17/728,474.

* cited by examiner

DISPLAY APPARATUS

CROSS-REFERENCE TO RELATED APPLICATIONS

This application is a continuation application of U.S. patent application Ser. No. 17/728,474 filed Apr. 25, 2022, which is a continuation application of U.S. Divisional patent application Ser. No. 17/095,857 filed Nov. 12, 2020, issued as U.S. Pat. No. 11,329,121 on May 10, 2022, which is a divisional application of U.S. patent application Ser. No. 16/375,063 filed Apr. 4, 2019 and issued as U.S. Pat. No. 10,868,101 on Dec. 15, 2020, which claims priority under 35 U.S.C. § 119 to Korean Patent Application No. 10-2018-0062902, filed on May 31, 2018, in the Korean Intellectual Property Office, the disclosures of which are incorporated by reference herein in their entirety.

TECHNICAL FIELD

Exemplary embodiments relate to a display apparatus, and more particularly, to a display apparatus in which occurrence of defects in a manufacturing process is minimized or reduced.

DISCUSSION OF THE RELATED ART

In general, a display apparatus has a display area in which a plurality of pixels are arranged. Wires are positioned in a peripheral area outside of the display area, and transmit an electrical signal to be applied to the pixels in the display area or a circuit portion positioned outside of the display area. To manufacture the display apparatus, a process of forming various wires and insulating layers is performed.

SUMMARY

When various components of a display apparatus are formed, foreign substances may be generated and remain in a display area, which may result in the occurrence of defective light emission.

Exemplary embodiments of the present disclosure provide a display apparatus in which the occurrence of defects in a manufacturing process may be minimized or reduced.

According to an exemplary embodiment of the present disclosure, a display apparatus includes a substrate including a first edge, a second edge disposed opposite to the first edge, and a third edge connecting the first edge to the second edge. The display apparatus further includes a wire extending along at least one of the first, second, and third edges of the substrate and having an inner edge. The inner edge has a first portion and a second portion. The first portion is substantially parallel to the third edge, and the second portion extends in a direction crossing the first portion and extends away from a center of the substrate. The display apparatus further includes a first insulating layer covering a portion of the substrate. The portion of the substrate covered by the first insulating layer is closer to the center of the substrate than the wire, the first insulating layer covers the first portion of the wire and a part of the second portion of the wire, and a first end of the first insulating layer is disposed on the wire. The display apparatus further includes a second insulating layer covering the first insulating layer and having a second end disposed on the wire. A first distance between the first end and the second end covering the first portion of the wire is different from a second distance between the first end and the second end covering the second portion of the wire.

In an exemplary embodiment, a third distance between the first end of the first insulating layer and the second end of the second insulating layer in an outer area of the wire is about equal to the first distance.

In an exemplary embodiment, the second distance is greater than the first distance.

In an exemplary embodiment, the second distance is equal to or greater than about 5 μm.

In an exemplary embodiment, the second distance is equal to or greater than about 10 μm.

In an exemplary embodiment, a part of the first end of the first insulating layer is bent and crosses the second portion of the wire, and has a first curvature radius. Further, a part of the second end of the second insulating layer is bent and crosses the second portion of the wire, and has a second curvature radius.

In an exemplary embodiment, a part of the first end of the first insulating layer is bent and crosses the second portion of the wire, and has a first straight line shape extending in a direction crossing the first edge and the third edge on the wire. Further, a part of the second end of the second insulating layer is bent and crosses the second portion of the wire, and has a second straight line shape extending in the direction crossing the first edge and the third edge on the wire. A length of the second straight line shape is greater than a length of the first straight line shape.

According to an exemplary embodiment of the present disclosure, a display apparatus includes a substrate including a first edge, a second edge disposed opposite to the first edge, and a third edge connecting the first edge to the second edge. The display apparatus further includes a wire extending along at least one of the first, second, and third edges of the substrate and having an inner edge. The inner edge has a first portion and a second portion. The first portion is substantially parallel to the third edge, and the second portion extends in a direction crossing the first portion and extends away from a center of the substrate. The display apparatus further includes a first insulating layer covering a portion of the substrate. The portion of the substrate covered by the first insulating layer is closer to the center of the substrate than the wire, the first insulating layer covers the first portion of the wire and a part of the second portion of the wire, and a first end of the first insulating layer is disposed on the wire. The display apparatus further includes a second insulating layer covering the first insulating layer and having a second end disposed on the wire. At least one of a first distance between the first end and the second end covering the first portion of the wire or a second distance between the first end and the second end covering the second portion of the wire alternates between a first value and a second value along the first or second portions of the wire. The first value and the second value are different from each other.

In an exemplary embodiment, only one of the first distance and the second distance alternates between the first value and the second value along one of the first and second portions of the wire in a direction toward the center of the substrate.

In an exemplary embodiment, the other one of the first distance and the second distance is constant along the other one of the first and second portions of the wire in the direction toward the center of the substrate.

In an exemplary embodiment, the second distance alternates between the first value and the second value along the second portion of the wire in the direction toward the center of the substrate.

In an exemplary embodiment, a third distance between the first end of the first insulating layer and the second end of the second insulating layer in an outer area of the wire is about equal to the first distance.

In an exemplary embodiment, a greater value between the first value and the second value is greater than the other one of the first distance and the second distance.

In an exemplary embodiment, a greater value between the first value and the second value is equal to or greater than about 5 μm.

In an exemplary embodiment, a greater value between the first value and the second value is equal to or greater than about 10 μm.

In an exemplary embodiment, a part of the first end of the first insulating layer is bent and crosses the second portion of the wire, and has a first curvature radius. Further, a part of the second end of the second insulating layer is bent and crosses the second portion of the wire, and has a second curvature radius.

In an exemplary embodiment, a part of the first end of the first insulating layer is bent and crosses the second portion of the wire, and has a first straight line shape extending in a direction crossing the first edge and the third edge on the wire. Further, a part of the second end of the second insulating layer is bent and crosses the second portion of the wire, and has a second straight line shape extending in the direction crossing the first edge and the third edge on the wire. A length of the second straight line shape is greater than a length of the first straight line shape.

According to an exemplary embodiment of the present disclosure, a display apparatus includes a substrate including a first edge, a second edge disposed opposite to the first edge, and a third edge connecting the first edge to the second edge. The display apparatus further includes a wire extending along at least one of the first, second, and third edges of the substrate and having an inner edge. The inner edge has a first portion and a second portion, the first portion is substantially parallel to the third edge, and the second portion extends in a direction crossing the first portion and extends away from a center of the substrate. The display apparatus further includes a first insulating layer covering a portion of the substrate. The portion of the substrate covered by the first insulating layer is closer to the center of the substrate than the wire, the first insulating layer partly covers the wire, and a first end of the first insulating layer is disposed on the wire.

In an exemplary embodiment, the display apparatus further includes a second insulating layer covering the first insulating layer and having a second end disposed on the wire. A part of the first end of the first insulating layer is bent and crosses the second portion of the wire, and has a first curvature radius. Further, a part of the second end of the second insulating layer is bent and crosses the second portion of the wire, and has a second curvature radius.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
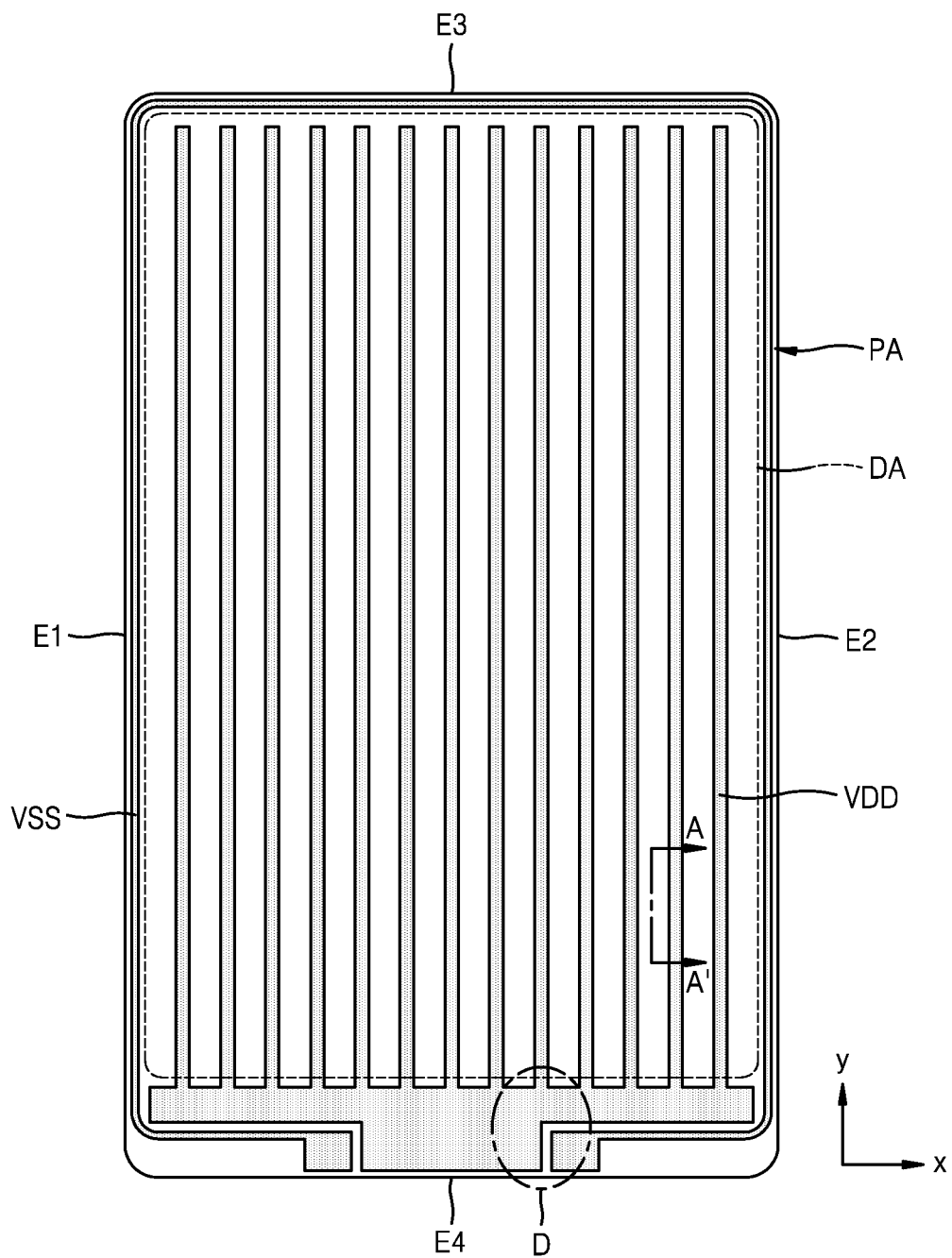
FIG. 1 is a plan view illustrating a part of a display apparatus, according to an embodiment.

Exemplary embodiments of the present disclosure will be described more fully hereinafter with reference to the accompanying drawings. Like reference numerals may refer to like elements throughout the accompanying drawings.

Hereinafter, in one or more exemplary embodiments, the X-axis, Y-axis, and Z-axis are not to be limited to the three axes of a rectangular coordinate system, but may be interpreted in a broad meaning including three axes not substantially perpendicular to one another. Thus, the X-axis, Y-axis, and Z-axis may be substantially perpendicular to each other or may indicate different directions that are not substantially perpendicular to one another.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" over "overlapping" another component, it can be the only component covering or overlapping the other component, or one or more intervening components may also be covering or overlapping the other component.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
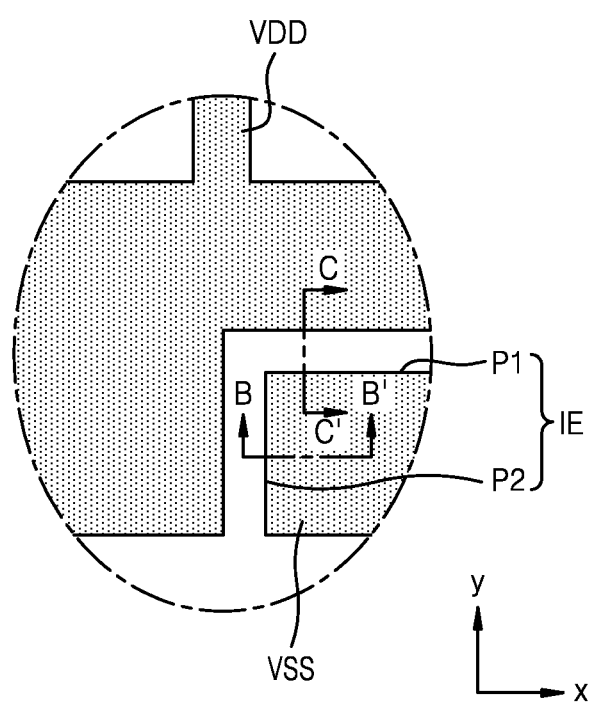
FIG. 2 is a conceptual diagram of an enlarged portion D of the display apparatus of FIG. 1, according to an exemplary embodiment.

FIG. 1 is a plan view illustrating a part of a display apparatus, according to an exemplary embodiment. FIG. 2 is a conceptual diagram of an enlarged portion D of the display apparatus of FIG. 1, according to an exemplary embodiment.

As illustrated in FIG. 1, in an exemplary embodiment, a display apparatus has a display area DA in which a plurality of pixels are arranged and a peripheral area PA disposed outside of the display area DA. It will be understood that a substrate 100 (refer to FIG. 3) includes the display area DA and the peripheral area PA. The peripheral area PA includes a pad area to which various electrical elements including, for example, an integrated circuit (IC) or a printed circuit board (PCB), are electrically connected. An electrode power supply line VSS electrically connected to opposite electrodes 315 and 325 (refer to FIG. 3) extending from the display area DA to the peripheral area PA, a power supply line VDD extending to the display area DA, or the like may also be arranged in the peripheral area PA.

The substrate 100 may include various materials and may be flexible or bendable. For example, the substrate 100 may include polymer resins such as polyether sulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). Alternatively, the substrate 100 may be modified to have a multi-stack structure including two layers and a barrier layer interposed between the two layers, the two layers including polymer resins and the barrier layer including an inorganic material (e.g., silicon oxide, silicon nitride, silicon oxynitride, or the like). However, the present disclosure is not limited thereto. For example, in an exemplary embodiment, the substrate 100 may include glass.

Edges of the substrate 100 may have a shape similar to an overall rectangular shape or an overall square shape. That is, the edges of the substrate 100 may substantially form a rectangle or a square. In an exemplary embodiment, the substrate 100 includes a first edge E1 and a second edge E2 facing each other, a third edge E3 connecting one end of the first edge E1 to one end of the second edge E2, and a fourth edge E4 facing the third edge E3 and connecting the other end of the first edge E1 to the other end of the second edge E2. FIG. 1 illustrates that the substrate 100 has an overall rectangular shape, however the present disclosure is not limited thereto. For example, in an exemplary embodiment, the fourth edge E4 may have a shape that is bent a plurality of times when seen in a plan view. In a completely manufactured display apparatus, at least a portion of the substrate 100 may be bent.

FIG. 1 illustrates that the power supply lines VDD (in a −y direction) are connected to one another at ends of the power supply lines VDD, and the electrode power supply line VSS extends along the first edge E1, the third edge E3, and the second edge E2 of the substrate 100. In this regard, an end of the electrode power supply line VSS may function as a pad disposed on the substrate 100 that may be electrically connected to a component. With respect to the power supply lines VDD, an end of connections between the power supply lines VDD may function as a pad disposed on the substrate 100 that may be electrically connected to a component. In an exemplary embodiment, the pad area to which various electrical elements including an IC or a PCB are electrically connected may be arranged near the fourth edge E4 of the substrate 100.

In exemplary embodiments, the electrode power supply line VSS is a wire that extends along at least one of the side ends of the substrate 100. For example, as described above, the electrode power supply line VSS may extend along the first edge E1, the third edge E3, and the second edge E2 of the substrate 100. A portion including both ends of the electrode power supply line VSS may be arranged near the fourth edge E4, as illustrated in FIG. 1. Since the electrode power supply line VSS is a wire having a width, the electrode power supply line VSS has an inner edge and an outer edge along its extension direction. For example, as illustrated in FIG. 2, the inner edge IE of the electrode power supply line VSS has a first portion P1 and a second portion P2. The inner edge IE refers to an edge that is adjacent to a center region of the substrate 100 with respect to an extension axis, which is crossing a width direction, along which the electrode power supply line VSS extends. The extension axis may cross a width direction of the electrode power supply line VSS. The first portion P1 of the inner edge IE is substantially parallel to the third edge E3 of the substrate 100. The second portion P2 of the inner edge IE refers to a portion that extends in a direction (the −y direction) crossing the first portion P1, and thus extends away from a center of the substrate 100. As illustrated in FIG. 1, the power supply lines VDD are connected to one another at one end, and the first portion P1 and the second portion P2 of the electrode power supply line VSS may be arranged near the connections of the power supply lines VDD (e.g., a lower portion (in the −y direction) of the substrate 100).

Figure 3:
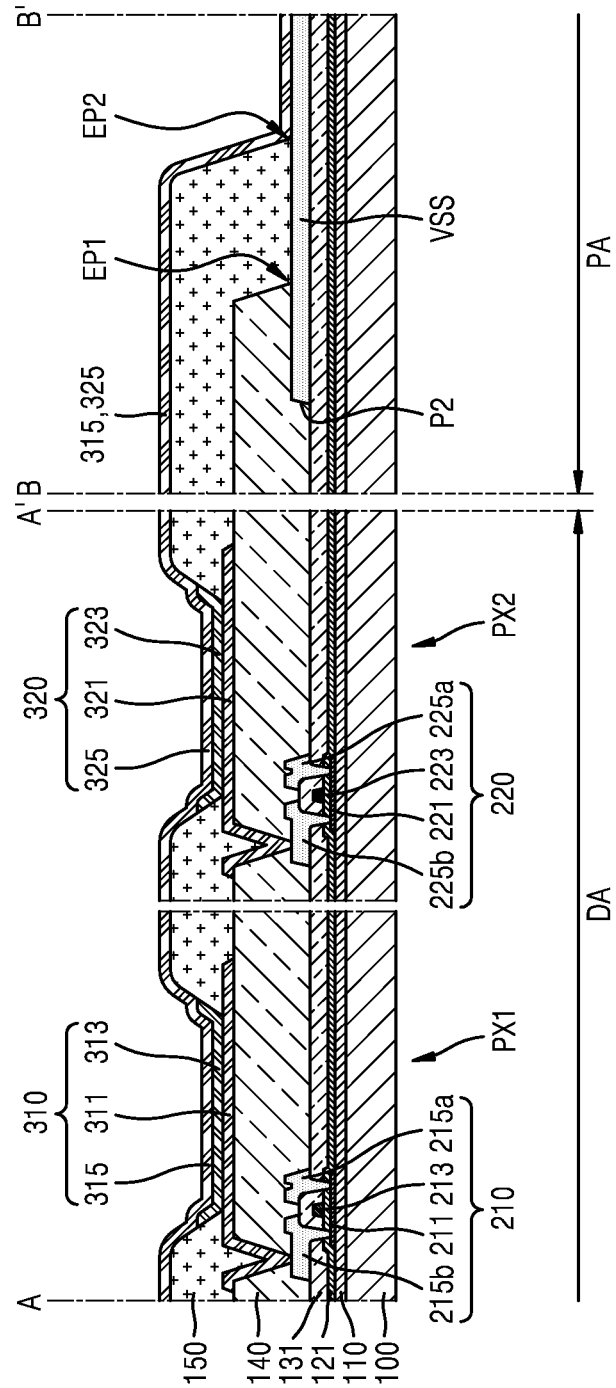
FIG. 3 is a cross-sectional view of the display apparatus of FIG. 1 taken along line A-A' of FIG. 1 and line B-B' of FIG. 2, according to an exemplary embodiment.
Figure 4:
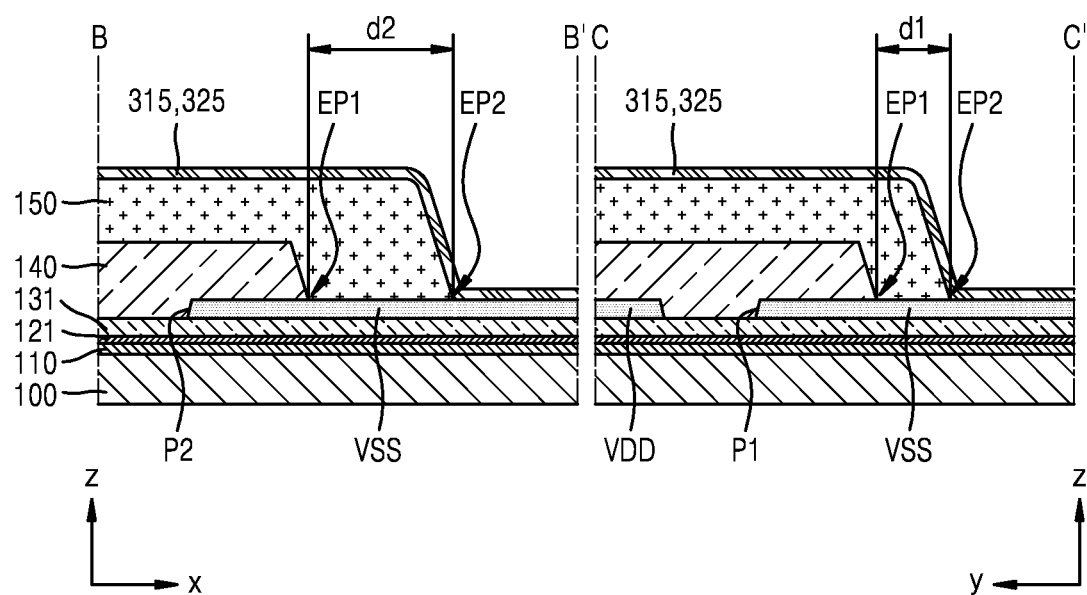
FIG. 4 is a cross-sectional view of the display apparatus of FIG. 1 taken along lines B-B' and C-C' of FIG. 2, according to an exemplary embodiment.
Figure 5:
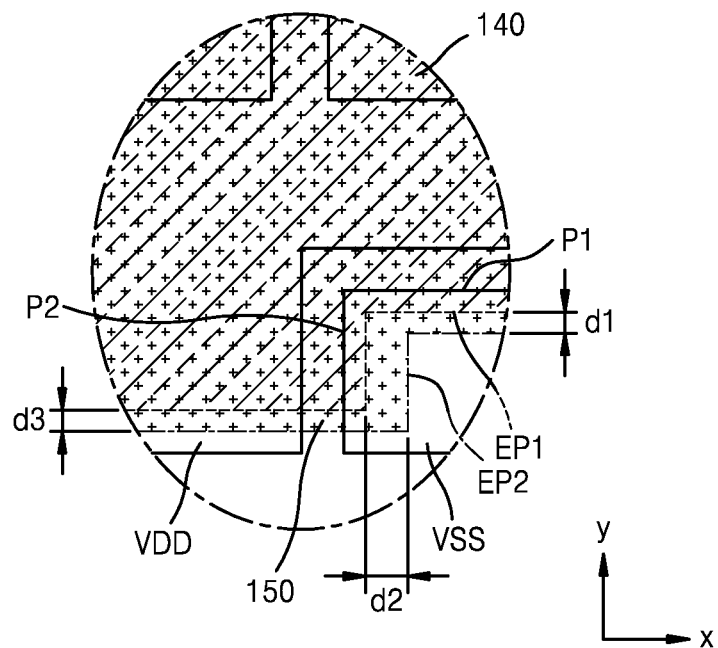
FIG. 5 is a conceptual diagram illustrating the portion D of FIG. 1, according to an exemplary embodiment.

FIG. 3 is a cross-sectional view of the display apparatus of FIG. 1 taken along line A-A' of FIG. 1 and line B-B' of FIG. 2, according to an exemplary embodiment. FIG. 4 is a cross-sectional view of the display apparatus of FIG. 1 taken along lines B-B' and C-C' of FIG. 2, according to an exemplary embodiment. FIG. 5 is a conceptual diagram illustrating the portion D of FIG. 1, according to an exemplary embodiment.

FIGS. 3 and 4 are cross-sectional views of portions that are spaced apart from each other in FIG. 1 and are not adjacent to each other. FIG. 3 illustrates a pixel PX1 and a pixel PX2. As illustrated in FIG. 3, the pixel PX1 and the pixel PX2 may not be adjacent pixels. Also, FIG. 3 is the cross-sectional view of the portions that are spaced apart from each other in FIG. 1. In an exemplary embodiment, cross-sections of the portions that are spaced apart from each other are not in the same direction. That is, for convenience of illustration, line A-A' of FIG. 1 is shown as a straight line, however, in exemplary embodiments, line A-A' may be a curved line or a may be bent a plurality of times. In any case, it is understood that FIG. 3 is the cross-sectional view illustrating portions of the pixel PX1 and the pixel PX2 in the display area DA and a portion of the peripheral area PA.

As illustrated in FIG. 3, display devices 310 and 320 (also respectively referred to as first and second display devices 310 and 320), and thin-film transistors 210 and 220 (also respectively referred to as first and second thin-film transistors 210 and 220) to which the display devices 310 and 320 are electrically connected, may be arranged in the display area DA of the substrate 100. FIG. 3 illustrates that organic light-emitting diodes as the display devices 310 and 320 are arranged in the display area DA. That is, in an exemplary embodiment, the display devices 310 and 320 may be organic-light emitting diodes. As the display devices 310 and 320 are electrically respectively connected to the thin-film transistors 210 and 220, pixel electrodes 311 and 321 are respectively electrically connected to the thin-film transistors 210 and 220.

FIG. 3 illustrates that the first thin-film transistor 210 is arranged in the pixel PX1, the second thin-film transistor 220 is arranged in the pixel PX2, the first display device 310 is electrically connected to the first thin-film transistor 210, and the second display device 320 is electrically connected to the second thin-film transistor 220. Hereinafter, for convenience of description, the first thin-film transistor 210 and the first display device 310 will now be described, and it is to be understood that the descriptions thereof may also be applied to the second thin-film transistor 220 and the second display device 320. That is, for convenience of explanation, descriptions relating to a second semiconductor layer 221, a second gate electrode 223, a second source electrode 225*a*, and a second drain electrode 225*b* of the second thin-film transistor 220, and descriptions relating to the second pixel electrode 321, the opposite electrode 325, and an intermediate layer 323 of the second display device 320, are omitted. The opposite electrode 325 of the second display device 320 may be integrated with the opposite electrode 315 of the first display device 310.

The first thin-film transistor 210 may include a first semiconductor layer 211 including, for example, amorphous silicon, polysilicon, or an organic semiconductor material, a first gate electrode 213, a first source electrode 215*a*, and a first drain electrode 215*b*. To ensure insulation between the first semiconductor layer 211 and the first gate electrode 213, a first gate insulating layer 121 including an inorganic material such as, for example, silicon oxide, silicon nitride, and/or silicon oxynitride may be interposed between the first semiconductor layer 211 and the first gate electrode 213. In addition, an interlayer insulating layer 131 including an inorganic material such as, for example, silicon oxide, silicon nitride, and/or silicon oxynitride may be arranged on the first gate electrode 213, and the first source electrode 215*a* and the first drain electrode 215*b* may be arranged on the interlayer insulating layer 131. The first gate insulating layer 121 and the interlayer insulating layer 131 including the inorganic material may be formed by using, for example, a chemical vapor deposition (CVD) process or an atomic layer deposition (ALD) process. The same is applied to exemplary embodiments to be described below.

The first gate electrode 213, the first source electrode 215*a*, and the first drain electrode 215*b* may include various conductive materials. For example, the first gate electrode 213 may include molybdenum or aluminum, and may have a multi-stack structure. For example, the first gate electrode 213 may have a triple-layer structure including a molybdenum layer, an aluminum layer, and a molybdenum layer. The first source electrode 215*a* and the first drain electrode 215*b* may include titanium or aluminum, and may have a multi-stack structure. For example, the first source electrode 215*a* and the first drain electrode 215*b* may each have a triple-layer structure including a titanium layer, an aluminum layer, and a titanium layer. However, the present disclosure is not limited thereto.

A buffer layer 110 including an inorganic material such as, for example, silicon oxide, silicon nitride and/or silicon oxynitride may be interposed between the first thin-film transistor 210 and the substrate 100. The buffer layer 110 may be configured to improve planarization of a top surface of the substrate 100, or to prevent or minimize penetration of impurities from the substrate 100 into the first semiconductor layer 211 of the first thin-film transistor 210.

As described above, the electrode power supply line VSS is arranged in the peripheral area PA of the substrate 100. In this regard, the electrode power supply line VSS may include the same material as the first source electrode 215*a* and the first drain electrode 215*b* in the display area DA, and may be arranged on the same layer as the first source electrode 215*a* and the first drain electrode 215*b*. That is, during a manufacturing process, the electrode power supply line VSS may be formed from the same material layer as the first source electrode 215*a* and the first drain electrode 215*b* at the same time. Accordingly, the electrode power supply line VSS may have the same layered structure as the first source electrode 215*a* and the first drain electrode 215*b*.

A first insulating layer 140 that is a planarization layer may be arranged over the first thin-film transistor 210. For example, as illustrated in FIG. 3, when an organic light-emitting diode is arranged over the first thin-film transistor 210, the first insulating layer 140 may generally planarize a top surface of a protective layer covering the first thin-film transistor 210. The first insulating layer 140 may include an organic material such as, for example, acryl, benzocyclobutene (BCB), hexamethyldisiloxane (HMDSO), or the like. FIG. 3 illustrates that the first insulating layer 140 has a single-layer structure, however, the present disclosure is not limited thereto. For example, in an exemplary embodiment, the first insulating layer 140 may be variously modified, and thus may have a multi-stack structure.

In addition to being arranged in the display area DA, the first insulating layer 140 may also be arranged in the peripheral area PA. That is, as illustrated in FIGS. 3 to 5, in an exemplary embodiment, the first insulating layer 140 covers a portion of the electrode power supply line VSS and covers a portion of the substrate 100.

For example, in an exemplary embodiment, the first insulating layer 140 covers a portion of the substrate 100 that is closer to the center of the substrate 100 than the electrode power supply line VSS. This is shown, for example, by viewing FIGS. 1 to 4 in conjunction with one another. For example, referring to line B-B' in FIGS. 2 and 4, it can be seen that when viewing the first insulating layer 140 as it extends in the x-direction, the first insulating layer 140 covers a portion of the substrate 100, then covers a portion of the electrode power supply line VSS, and then terminates at the first end EP1. Thus, the portion of the substrate 100 that is covered by the first insulating layer 140 is closer to the center of the substrate 100 than the electrode power supply line VSS in the x-direction. That is, the first insulating layer 140 covers a portion of the substrate 100 that is closer to the center of the substrate 100 than the electrode power supply line VSS in the x-direction. Stated another way, relative to the center of the substrate 100 in the x-direction, the portion of the substrate 100 that is covered by the first insulating layer 140 is closer than the electrode power supply line VSS.

In addition, referring to line C-C' in FIGS. 2 and 4, it can be seen that when viewing the first insulating layer 140 as it extends in the y-direction, the first insulating layer 140 covers a portion of the substrate 100, then covers a portion of the electrode power supply line VSS, and then terminates at the first end EP1. Thus, the portion of the substrate 100 that is covered by the first insulating layer 140 is closer to the center of the substrate 100 than the electrode power supply line VSS in the y-direction. That is, the first insulating layer 140 covers a portion of the substrate 100 that is closer to the center of the substrate 100 than the electrode power supply line VSS in the y-direction. Stated another way, relative to the center of the substrate 100 in the y-direction, the portion of the substrate 100 that is covered by the first insulating layer 140 is closer than the electrode power supply line VSS.

In addition, as can be seen in FIGS. 2 and 4, the first insulating layer 140 covers a part of the second portion P2 and the first portion P1 of the electrode power supply line VSS. Thus, the first insulating layer 140 partly covers the electrode power supply line VSS, and the first insulating layer 140 has a first end EP1 disposed on the electrode power supply line VSS.

The first display device 310 may be arranged on the first insulating layer 140 in the display area DA. The first display device 310 may be, for example, an organic light-emitting diode including the first pixel electrode 311, the opposite electrode 315, and an intermediate layer 313 interposed therebetween and including an emission layer. As illustrated in FIG. 3, the first pixel electrode 311 (hereinafter also referred to as the pixel electrode 311) contacts one of the first source electrode 215a and the first drain electrode 215b via an opening formed in the first insulating layer 140, and thus is electrically connected to the first thin-film transistor 210. The pixel electrode 311 may include, for example, indium tin oxide (ITO), indium zinc oxide (IZO), indium(III) oxide ($In_2O_3$), or the like. In exemplary embodiments, the pixel electrode 311 may include a material different from ITO, IZO, $In_2O_3$, or the like. For example, in an exemplary embodiment, the pixel electrode 311 may include metal such as aluminum, copper, or the like.

A second insulating layer 150 that may function as a pixel-defining layer may be arranged over the first insulating layer 140. The second insulating layer 150 may be configured to define a pixel by having respective openings corresponding to sub-pixels, for example, by having an opening for exposing at least a center portion of the pixel electrode 311. As illustrated in FIG. 3, the second insulating layer 150 may also be configured to prevent occurrence of an arc at edges of the pixel electrode 311 by increasing a distance between the edges of the pixel electrode 311 and the opposite electrode 315 over the pixel electrode 311. The second insulating layer 150 may include an organic material such as, for example, hexamethyldisiloxane (HMDSO) or the like.

As illustrated in FIGS. 3 to 5, the second insulating layer 150 may also be present in the peripheral area PA of the substrate 100. In this case, the second insulating layer 150 covers the first insulating layer 140 that is the planarization layer, and has a second end EP2 on the electrode power supply line VSS that is the wire. In this regard, a first distance d1 between the first end EP1 and the second end EP2 covering the first portion P1 of the electrode power supply line VSS is different from a second distance d2 between the first end EP1 and the second end EP2 covering the second portion P2 of the electrode power supply line VSS. Referring to FIGS. 4 and 5, the second distance d2 is greater than the first distance d1.

The intermediate layer 313 of the organic light-emitting diode may include a small-molecule or polymer material. When the intermediate layer 313 includes a small-molecule material, the intermediate layer 313 may have a structure in which a hole injection layer (HIL), a hole transport layer (HTL), the emission layer, an electron transport layer (ETL), an electron injection layer (EIL), and the like are singularly or multiply stacked, and may be formed using, for example, a vacuum deposition method. When the intermediate layer 313 includes a polymer material, the intermediate layer 313 may have a structure including the HTL and the emission layer. In this regard, the HTL may include poly-(2,4)-ethylene-dihydroxy thiophene (PEDOT), and the emission layer may include poly-phenylene vinylene (PPV)-based polymer materials, polyfluorene-based polymer materials, and the like. The intermediate layer 313 may be formed by using, for example, a screen printing method, an inkjet printing method, a laser induced thermal imaging (LITI) method, or the like. The intermediate layer 313 is not limited thereto and thus may have various structures. The intermediate layer 313 may include one layer extending over a plurality of the pixel electrodes 311 and 321, or may include a layer that is patterned to correspond to each of the plurality of pixel electrodes 311 and 321.

The opposite electrode 315 may be provided over the display area DA, and may cover the display area DA. That is, the opposite electrode 315 may be formed as one body extending over the organic light-emitting diodes, and thus may correspond to the plurality of pixel electrodes 311 and 321. The opposite electrode 315 extends to the peripheral area PA, and thus, as illustrated in FIG. 3, may be electrically connected to the electrode power supply line VSS in the peripheral area PA. FIG. 3 illustrates that the opposite electrode 315 directly contacts the electrode power supply line VSS, however, the present disclosure is not limited thereto. For example, in an exemplary embodiment, an electrode layer including the same material as the first pixel electrode 311 may be interposed between the electrode power supply line VSS and the opposite electrode 315.

In the display apparatus according to an exemplary embodiment, occurrence of defects in the display area DA due to impurities created in a manufacturing process may be efficiently prevented. The display apparatus according to an exemplary embodiment has a various layered structure, and thus, impurities such as particles may remain during a process of forming and patterning layers in the manufacturing process. Thus, a process of removing the impurities may be performed. The process of removing the impurities may include, for example, spraying air onto the impurities. Air spraying is performed using an air gun or the like. In an exemplary embodiment, the air gun does not perpendicularly spray air, but rather, may spray air onto the substrate 100 at a preset angle. For example, referring to FIG. 1, the air gun may spray air onto the substrate 100 at an angle of about 45 degrees in a direction of a resultant vector of a sum of an −x direction vector and a −z direction vector.

The air spraying is performed even after the second insulating layer 150 having a preset shape (pattern) is formed. At this time, because air is sprayed at high pressure, a portion of the second insulating layer 150 may be chipped off. When adhesion between the second insulating layer 150 including an organic material and the electrode power supply line VSS is weak, a part of an end of the second insulating layer 150 (the end directly contacting the electrode power supply line VSS) may be chipped off. When the air gun sprays air onto the substrate 100 in the direction of the resultant vector of the sum of the −x direction vector and the −z direction vector, a part of the second end EP2 of the second insulating layer 150 (the second end EP2 covering, by extending in a y direction, the second portion P2 of the electrode power supply line VSS) may be chipped off. This is because air is sprayed vertically onto the part of the second end EP2 of the second insulating layer 150 (the second end EP2 covering, by extending in a y direction, the second portion P2 of the electrode power supply line VSS). In this case, the part chipped off from the second insulating layer 150 may become a particle, and thus may remain in the display area DA. In this case, the particle may cause defects in a process of forming the pixel electrodes 311 and 321, the intermediate layers 313 and 323, and the opposite electrodes 315 and 325.

However, in the display apparatus according to an exemplary embodiment, as described above, the second distance d2 between the first end EP1 and the second end EP2 covering the second portion P2 of the electrode power supply line VSS is set to be greater than the first distance d1 between the first end EP1 and the second end EP2 covering the first portion P1 of the electrode power supply line VSS. As a result, a contact area between the second insulating layer 150 and the electrode power supply line VSS, the contact area being close to the second end EP2 of the second insulating layer 150 which covers the second portion P2 of the electrode power supply line VSS, may be increased. As a result, the part of the second insulating layer 150 may be efficiently prevented from being chipped off from the electrode power supply line VSS. In an area near the second end EP2 of the second insulating layer 150 which covers the first portion P1 of the electrode power supply line VSS, a direction in which the air gun sprays air is substantially parallel to a direction (a −x direction) in which the second end EP2 is extended in the area. As a result, damage due to the air gun does not occur. Thus, in an exemplary embodiment, it is not necessary to increase the first distance d1 between the first end EP1 and the second end EP2 covering the first portion P1 of the electrode power supply line VSS.

In an exemplary embodiment, the air gun does not spray air onto the substrate 100 in the direction of the resultant vector of the sum of the −x direction vector and the −z direction vector, but rather, may spray air onto the substrate 100 in a direction of a resultant vector of a sum of a +y direction vector and the −z direction vector. In this case, since the first distance d1 is greater than the second distance d2, the part of the second insulating layer 150 may be efficiently prevented from being chipped off in the area near the second end EP2 of the second insulating layer 150 which covers the first portion P1 of the electrode power supply line VSS. That is, the first distance d1 between the first end EP1 and the second end EP2 covering the first portion P1 of the electrode power supply line VSS is set to be different from the second distance d2 between the first end EP1 and the second end EP2 covering the second portion P2 of the electrode power supply line VSS, and the greater one of the first distance d1 and the second distance d2 is set according to a direction of the air gun in the manufacturing process. As a result, occurrence of defects during the manufacturing process may be minimized or reduced.

As illustrated in FIGS. 3 to 5, as confirmed via testing, when the second distance d2 is set to be equal to or greater than about 5 μm, the part of the second insulating layer 150 may be prevented from being chipped off and causing defects. For example, according to an exemplary embodiment, when the second distance d2 is set to be equal to or greater than about 10 μm, it is confirmed that the second insulating layer 150 is not chipped off. However, the second distance d2 cannot be increased without limit, and in consideration of positions of other elements, the second distance d2 may be less than about 20 μm according to exemplary embodiments.

As illustrated in FIG. 5, the first insulating layer 140 and the second insulating layer 150 are arranged in an area outside of the electrode power supply line VSS. In this regard, a third distance d3 between the first end EP1 of the first insulating layer 140 and the second end EP2 of the second insulating layer 150 may be defined in the area outside of the electrode power supply line VSS, and the third distance d3 may be about equal to the first distance d1. This is because a direction (the −x direction) in which the end of the second insulating layer 150 extends outside of the electrode power supply line VSS (e.g., on the power supply line VDD), is about equal to a direction (the −x direction) in which the second end EP2 of the second insulating layer 150 extends on the electrode power supply line VSS.

Figure 6:
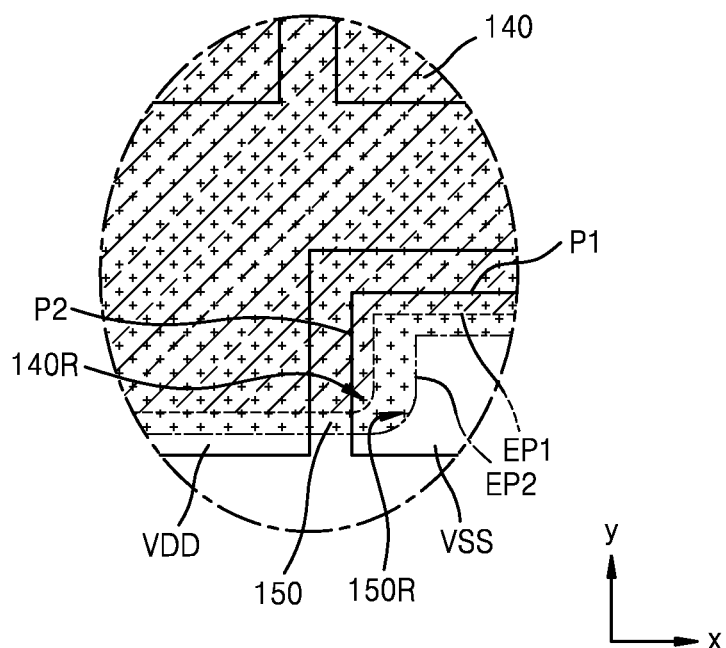
FIG. 6 is a conceptual diagram of the portion D of FIG. 1, according to an exemplary embodiment.

FIG. 6 is a conceptual diagram of the portion D of FIG. 1, according to an exemplary embodiment. The display apparatus according to the exemplary embodiment of FIG. 6 is different from the display apparatus according to the exemplary embodiment of FIG. 5 in relation between a first curvature radius 140R of the first insulating layer 140 and a second curvature radius 150R of the second insulating layer 150. For example, in the display apparatus according to the exemplary embodiment of FIG. 6, a part of the first end EP1 of the first insulating layer 140 on the electrode power supply line VSS (the part being bent to cross the second portion P2 of the electrode power supply line VSS) has the first curvature radius 140R, and a part of the second end EP2 of the second insulating layer 150 on the electrode power supply line VSS (the part being bent to cross the second portion P2 of the electrode power supply line VSS) has the second curvature radius 150R. In this regard, a value of the second curvature radius 150R may be set to be greater than a value of the first curvature radius 140R.

After the second insulating layer 150 having the aforementioned preset shape is formed, air is sprayed using an air gun or the like. When the air gun sprays air onto the substrate 100 in a direction of a resultant vector of a sum of a −x direction vector and a −z direction vector, or in a direction of a sum of a resultant vector of a sum of a +y direction vector and the −z direction vector, a part of the second insulating layer 150 to which a greatest pressure is applied is a part of the second end EP2 on the electrode power supply line VSS (the part being bent to cross the second portion P2 of the electrode power supply line VSS). This is because the part has a projected shape according to the shape of the second insulating layer 150. Thus, as the part has a curvature rather than having a shape of about 90 degrees, the part may be efficiently prevented from being chipped off in the manufacturing process. For example, when a curvature radius is increased, a probability of damage due to a pressure of applied air is decreased. Therefore, a value of the second curvature radius 150R of the second insulating layer 150 may be set to be greater than a value of the first curvature radius 140R of the first insulating layer 140 in an exemplary embodiment.

Figure 7:
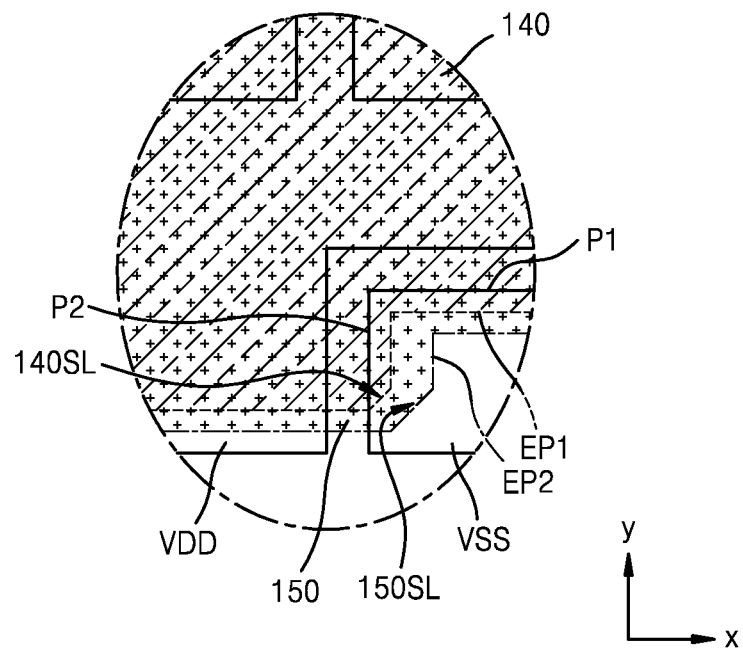
FIG. 7 is a conceptual diagram of the portion D of FIG. 1, according to an exemplary embodiment.

However, the present disclosure is not limited to the shape illustrated in FIG. 6. For example, as illustrated in FIG. 7, which is a conceptual diagram of the portion D of FIG. 1 according to an exemplary embodiment, a part of the first end EP1 of the first insulating layer 140 on the electrode power supply line VSS (the part being bent to cross the second portion P2 of the electrode power supply line VSS) may have a first straight line shape 140SL extending in a direction crossing the first edge E1 (refer to FIG. 1) and the third edge E3 (refer to FIG. 1) on the electrode power supply line VSS.

In the second insulating layer 150, a part of the second end EP2 of the second insulating layer 150 on the electrode power supply line VSS (the part being bent to cross the second portion P2 of the electrode power supply line VSS) may have a second straight line shape 150SL extending in a direction crossing the first edge E1 and the third edge E3 on the electrode power supply line VSS. In this regard, since a length of the second straight line shape 150SL is greater than a length of the first straight line shape 140SL, the same or a similar effect as that described above with reference to FIG. 6 may be obtained.

Figure 8:
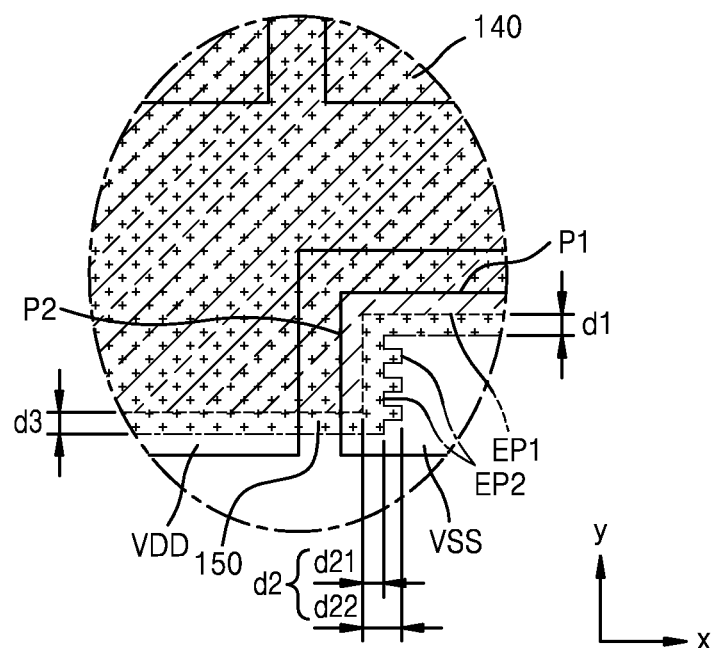
FIG. 8 is a conceptual diagram of the portion D of FIG. 1, according to an exemplary embodiment.

FIG. 8 is a conceptual diagram of the portion D of FIG. 1, according to an exemplary embodiment. The display apparatus according to the exemplary embodiment of FIG. 8 is different from the display apparatus described with reference to FIG. 5 in that the display apparatus according to the exemplary embodiment of FIG. 8 has a different shape with respect to the second insulating layer 150.

The display apparatus according to the exemplary embodiment of FIG. 8 includes the first insulating layer 140 and the second insulating layer 150. As described above with reference to FIG. 5, the first insulating layer 140 covers a portion of the substrate 100. For example, the first insulating layer 140 covers a portion of the substrate 100 that is closer to the center of the substrate 100 than the electrode power supply line VSS, and also covers a portion of the electrode power supply line VSS. In this regard, the first insulating layer 140 covers the first portion P1 and a portion of the second end EP2 of the electrode power supply line VSS. The first end EP1 is disposed on the electrode power supply line VSS. The second insulating layer 150 that covers the first insulating layer 140 includes the second end EP2, which is disposed on the electrode power supply line VSS.

In this regard, at least one of a first distance d1 between the first end EP1 and the second end EP2 covering the first portion P1 of the electrode power supply line VSS, and a second distance d2 between the first end EP1 and the second end EP2 covering the second portion P2 of the electrode power supply line VSS, alternates between a first value and a second value at an end of the electrode power supply line VSS in a center direction of the substrate 100, in which the first value and the second value are different from each other. FIG. 8 illustrates that the second distance d2 alternates between a first value d21 and a second value d22 that are different from each other along the second portion P2 of the electrode power supply line VSS in the center direction of the substrate 100.

As described above with reference to FIG. 5, when the second insulating layer 150 having the aforementioned preset shape is formed and then air is sprayed using an air gun or the like, a portion of the second insulating layer 150 may be chipped off. However, in the display apparatus according to the exemplary embodiment of FIG. 8, as described above, the second distance d2 between the first end EP1 and the second end EP2 covering the second portion P2 of the electrode power supply line VSS alternates between the first value d21 and the second value d22 that are different from each other along the second portion P2 of the electrode power supply line VSS in the center direction of the substrate 100. Accordingly, a length of the second end EP2 of the second insulating layer 150 that covers the second portion P2 of the electrode power supply line VSS is increased, and thus, adhesion between an area near the second end EP2 of the second insulating layer 150 and the electrode power supply line VSS may be improved. For example, the second value d22 that is greater than the first value d21 and covers the first portion P1 of the electrode power supply line VSS is set to be greater than the first distance d1 between the first end EP1 and the second end EP2. Therefore, the portion of the second insulating layer 150 may be efficiently prevented from being chipped off during air spraying. The first value d21 that is less than the second value d22 may be equal to the first distance d1 between the first end EP1 and the second end EP2 covering the first portion P1 of the electrode power supply line VSS.

A greater value between the first value d21 and the second value d22 may be set to be equal to or less than about 5 μm. As a result, the part of the second insulating layer 150 may be efficiently prevented from being chipped off and causing defects. For example, when the greater value between the first value d21 and the second value d22 is set to be equal to or greater than about 10 μm, testing confirms that the second insulating layer 150 is not chipped off. However, the greater value between the first value d21 and the second value d22 cannot be increased without limit, and in consideration of positions of other elements, the greater value may be less than about 20 μm according to exemplary embodiments.

The air gun may not spray air onto the substrate 100 in the direction of the resultant vector of the sum of the −x direction vector and the −z direction vector, but rather, may spray air onto the substrate 100 in the direction of the resultant vector of the sum of the +y direction vector and the −z direction vector. In this case, unlike what is illustrated in FIG. 8, the first distance d1 may alternate between a first value and a second value along the first portion P1 of the electrode power supply line VSS in the center direction of the substrate 100, in which the first value and the second value are different from each other. In this case, the second distance d2 may be constant along the second portion P2 of the electrode power supply line VSS in the center direction of the substrate 100.

However, the present disclosure is not limited thereto. For example, in an exemplary embodiment, the second distance d2 alternates between the first value d21 and the second value d22 that are different from each other along the second portion P2 of the electrode power supply line VSS in the center direction of the substrate 100, as illustrated in FIG. 8. The first distance d1 also alternates between a third value and a fourth value that are different from each other along the first portion P1 of the electrode power supply line VSS in the center direction of the substrate 100. In this regard, the third value may be equal to the first value d21, and the fourth value may be equal to the second value d22.

As illustrated in FIG. 8, the first insulating layer 140 and the second insulating layer 150 are arranged in an area outside of the electrode power supply line VSS. In this regard, a third distance d3 between the end of the first insulating layer 140 and the end of the second insulating layer 150 may be defined outside of the electrode power supply line VSS, and the third distance d3 may be equal to the aforementioned first distance d1. This is because a direction (the −x direction) in which the end of the second insulating layer 150 extends outside of the electrode power supply line VSS, e.g., on the power supply line VDD, is equal to a direction (the −x direction) in which the second end EP2 of the second insulating layer 150 extends on the electrode power supply line VSS.

FIG. 8 illustrates that a part of the second end EP2 of the second insulating layer 150 on the electrode power supply line VSS (the part being bent to cross the second portion P2 of the electrode power supply line VSS) is bent with an angle of about 90 degrees. However, the present disclosure is not limited thereto. For example, a structure described above with reference to FIG. 6 may be applied to a structure illustrated in FIG. 8.

That is, in the structure illustrated in FIG. 8, as described above with reference to FIG. 6, the part of the first end EP1 of the first insulating layer 140 on the electrode power supply line VSS (the part being bent to cross the second portion P2 of the electrode power supply line VSS) may have the first curvature radius 140R, the part of the second end EP2 of the second insulating layer 150 on the electrode power supply line VSS (the part being bent to cross the second portion P2 of the electrode power supply line VSS) may have the second curvature radius 150R, and a value of the second curvature radius 150R may be set to be greater than a value of the first curvature radius 140R.

Alternatively, in the structure illustrated in FIG. 8, as described above with reference to FIG. 7, the part of the first end EP1 of the first insulating layer 140 on the electrode power supply line VSS (the part being bent to cross the second portion P2 of the electrode power supply line VSS) may have the first straight line shape 140SL extending in the direction crossing the first edge E1 (refer to FIG. 1) and the third edge E3 (refer to FIG. 1) on the electrode power supply line VSS. In the second insulating layer 150, the part of the second end EP2 of the second insulating layer 150 on the electrode power supply line VSS (the part being bent to cross the second portion P2 of the electrode power supply line VSS) may have the second straight line shape 150SL extending in the direction crossing the first edge E1 and the third edge E3 on the electrode power supply line VSS. In this regard, as a result of a length of the second straight line shape 150SL being greater than a length of the first straight line shape 140SL, an effect that is the same as or similar to that achieved with respect to FIG. 8 may be achieved by modifying the structure illustrated in FIG. 8 with reference to FIG. 6.

In the above, a case in which the first gate electrode 213 of the first thin-film transistor 210, and the second gate electrode 223 of the second thin-film transistor 220 are provided on a same layer has been described. However, the present disclosure is not limited thereto.

Figure 9:
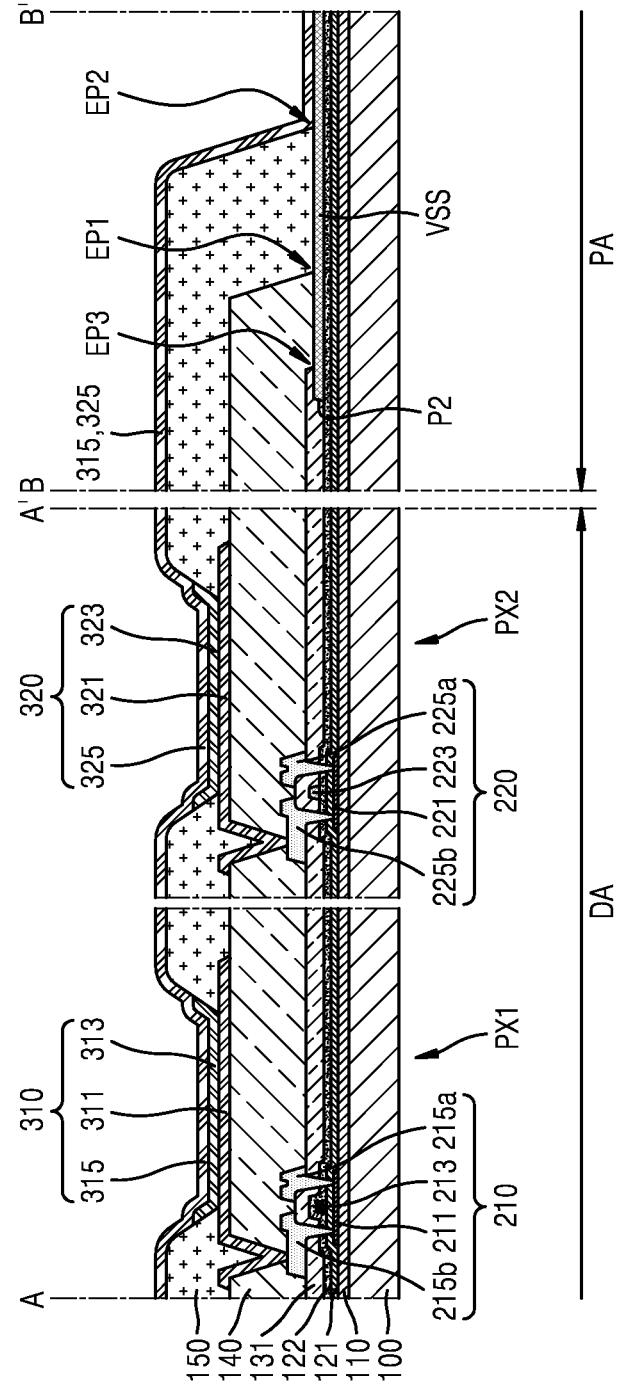
FIG. 9 is a cross-sectional view of the display apparatus of FIG. 1 taken along line A-A' of FIG. 1 and line B-B' of FIG. 2, according to an exemplary embodiment.
Figure 10:
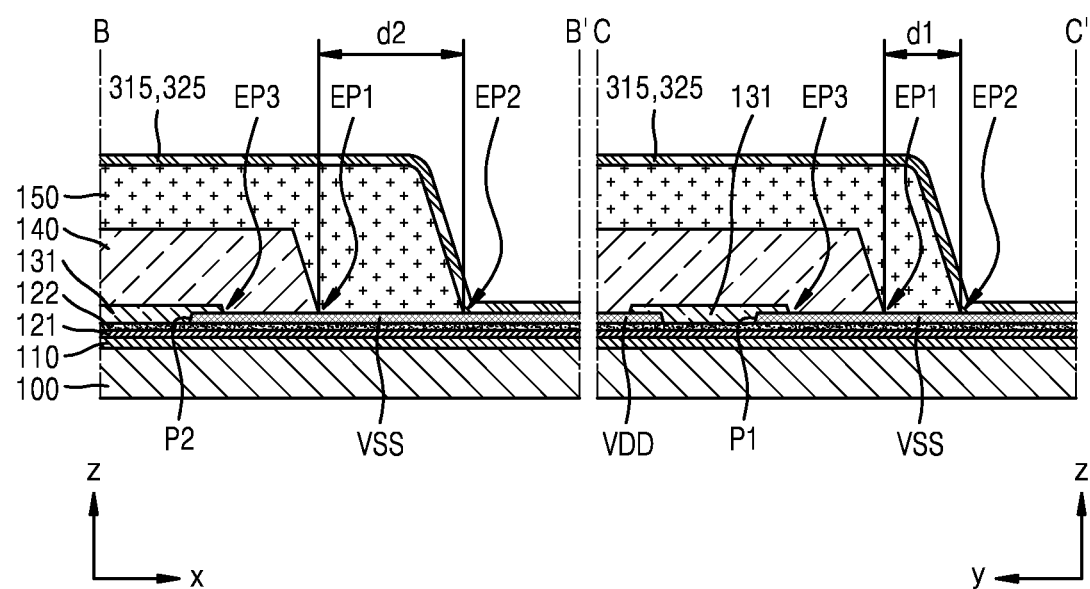
FIG. 10 is a cross-sectional view of the display apparatus of FIG. 1 taken along lines B-B' and C-C' of FIG. 2, according to an exemplary embodiment.

For example, as illustrated in FIG. 9, which is a cross-sectional view of the display apparatus of FIG. 1 taken along line A-A' of FIG. 1 and line B-B' of FIG. 2 according to an exemplary embodiment, and FIG. 10, which corresponds to FIG. 9 and is a cross-sectional view of the display apparatus of FIG. 1 taken along lines B-B' and C-C' of FIG. 2 according to an exemplary embodiment, a second gate insulating layer 122 covering the first gate electrode 213 of the first thin-film transistor 210 is further provided in addition to the first gate insulating layer 121, and the second gate electrode 223 of the second thin-film transistor 220 may be provided on the second gate insulating layer 122.

For example, the first gate electrode 213 and the second gate electrode 223 may be arranged on different layers. The first source electrode 215a, the first drain electrode 215b, the second source electrode 225a, and the second drain electrode 225b are arranged on the interlayer insulating layer 131 covering the second gate electrode 223. The second gate insulating layer 122 may include an inorganic material such as, for example, silicon oxide, silicon nitride, and/or silicon oxynitride. In this case, as illustrated in FIG. 9, the electrode power supply line VSS may be arranged on the electrode power supply line VSS. The electrode power supply line VSS may be formed from the same material layer as the second gate electrode 223 at the same time that the second gate electrode 223 is formed.

It is to be understood that the descriptions of the display apparatuses according to the exemplary embodiments described above with reference to FIGS. 5 to 8 may be applied to the display apparatus according to the exemplary embodiment of FIGS. 9 and 10. That is, descriptions of the shapes of the first insulating layer 140 and the second insulating layer 150 in the exemplary embodiments described above with reference to FIGS. 5 to 8 may be applied to the display apparatus according to the exemplary embodiment of FIGS. 9 and 10. For example, the first distance d1 between the first end EP1 and the second end EP2 covering the first portion P1 of the electrode power supply line VSS may be different from the second distance d2 between the first end EP1 and the second end EP2 covering the second portion P2 of the electrode power supply line VSS.

To obtain this configuration, the interlayer insulating layer 131 exposes the electrode power supply line VSS by having a third end EP3 on the electrode power supply line VSS that is the wire, and the first insulating layer 140 and the second insulating layer 150, which cover the interlayer insulating layer 131, contact the electrode power supply line VSS. In this regard, a portion of the interlayer insulating layer 131 which is arranged in the display area DA may be physically spaced apart from a portion of the interlayer insulating layer 131 which is arranged in the peripheral area PA. Accordingly, FIG. 10 illustrates that the interlayer insulating layer 131 covers a gap between the electrode power supply line VSS and the power supply line VDD in portion C-C', and has respective ends on the electrode power supply line VSS and the power supply line VDD.

Figure 11:
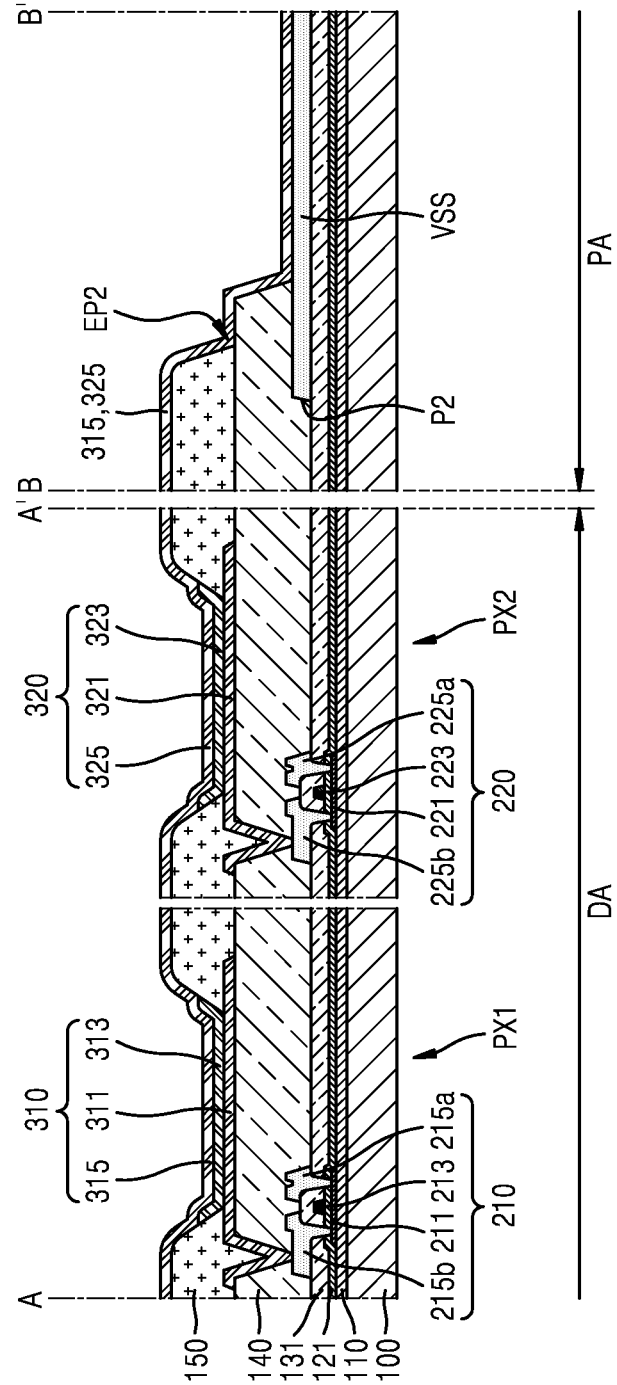
FIG. 11 is a cross-sectional view of the display apparatus of FIG. 1 taken along line A-A' of FIG. 1 and line B-B' of FIG. 2, according to an exemplary embodiment.

FIG. 11 is a cross-sectional view of the display apparatus of FIG. 1 taken along line A-A' of FIG. 1 and line B-B' of FIG. 2, according to an exemplary embodiment. In the above, a case in which the second end EP2 of the second insulating layer 150 on the electrode power supply line VSS contacts the electrode power supply line VSS has been described, however, the present disclosure is not limited thereto. For example, as illustrated in FIG. 11, in an exemplary embodiment, the second end EP2 of the second insulating layer 150 disposed over the electrode power supply line VSS may be disposed on the first insulating layer 140. Since both the second insulating layer 150 and the first insulating layer 140 include organic materials, adhesion between the first insulating layer 140 and the second insulating layer 150 is high. Thus, even when air is applied thereto by using an air gun, the second end EP2 of the second insulating layer 150 may be efficiently prevented from being chipped off.

Figure 12:
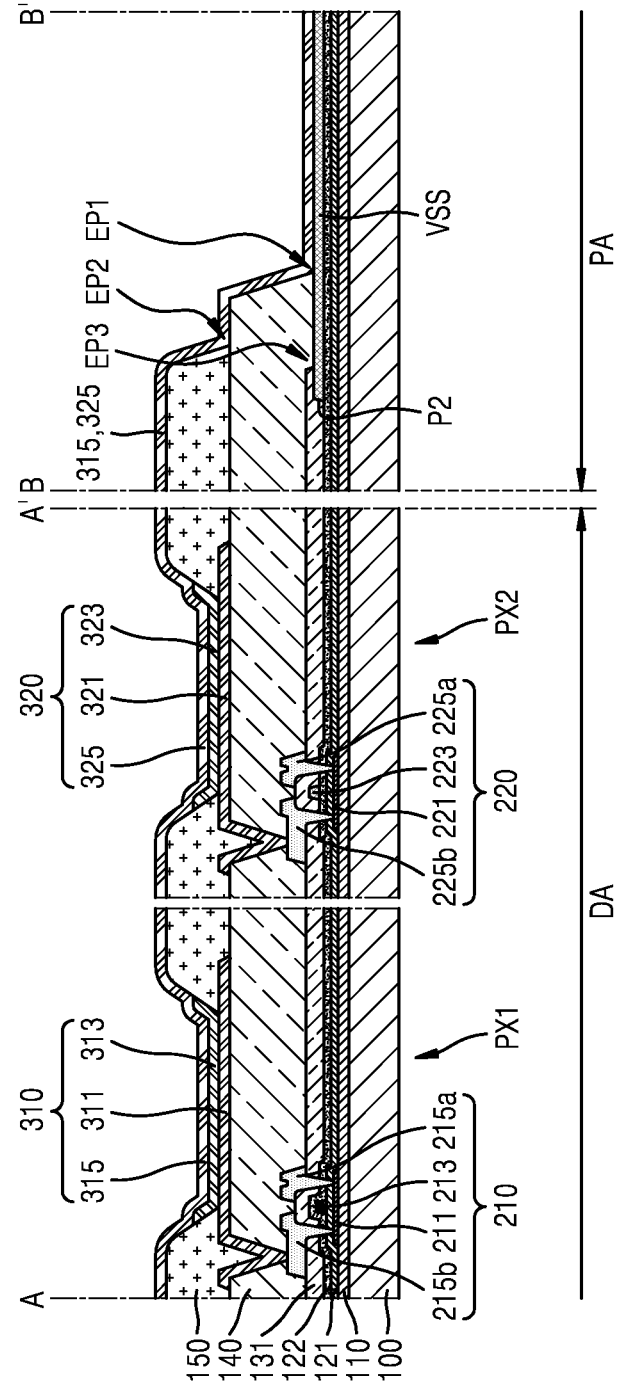
FIG. 12 is a cross-sectional view of the display apparatus of FIG. 1 taken along line A-A' of FIG. 1 and line B-B' of FIG. 2, according to an exemplary embodiment.

FIG. 11 illustrates a modified exemplary embodiment of FIG. 3, but as illustrated in FIG. 12, which is a modified exemplary embodiment of FIG. 9, the second end EP2 of the second insulating layer 150 disposed over the electrode power supply line VSS may be modified to be on the first insulating layer 140.

According to the exemplary embodiments described above, a display apparatus in which occurrence of defects in the manufacturing process is minimized or reduced is implemented. However, the scope of the present disclosure is not limited to the aforementioned effects.

It is to be understood that, when applicable, features or aspects described with reference to each exemplary embodiment should typically be considered as available for other similar features or aspects in other exemplary embodiments, as would be understood by one having ordinary skill in the art.

While the present disclosure has been particularly described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
a substrate comprising a first edge, a second edge disposed opposite to the first edge, and a third edge connecting the first edge to the second edge, the substrate comprising a display area and a peripheral area outside the display area;
a wire in the peripheral area, the wire extending along at least one of the first, second, and third edges of the substrate and having an inner edge, wherein the inner edge has a first portion and a second portion, the first portion is substantially parallel to the third edge, and the second portion extends in a direction crossing the first portion and extends away from a center of the substrate;
a first insulating layer extending in a direction from the display area to the wire, wherein the first insulating layer covers the first portion of the wire and a part of the second portion of the wire, and a first end of the first insulating layer is disposed on the wire; and
a second insulating layer extending in the direction from the display area to the wire and having a second end disposed on the wire, wherein a first distance between the first end and the second end covering the first portion of the wire is different from a second distance between the first end and the second end covering the second portion of the wire.

2. The display apparatus of claim 1, wherein a third distance between the first end of the first insulating layer and the second end of the second insulating layer in an outer area of the wire is about equal to the first distance.

3. The display apparatus of claim 1, wherein the second distance is greater than the first distance.

4. The display apparatus of claim 3, wherein the second distance is equal to or greater than about 5 μm.

5. The display apparatus of claim 3, wherein the second distance is equal to or greater than about 10 μm.

6. The display apparatus of claim 1, wherein
a part of the first end of the first insulating layer is bent and crosses the second portion of the wire, and has a first curvature radius, and
a part of the second end of the second insulating layer is bent and crosses the second portion of the wire, and has a second curvature radius.

7. The display apparatus of claim 1, wherein
a part of the first end of the first insulating layer is bent and crosses the second portion of the wire, and has a first straight line shape extending in a direction crossing the first edge and the third edge on the wire, and
a part of the second end of the second insulating layer is bent and crosses the second portion of the wire, and has a second straight line shape extending in the direction crossing the first edge and the third edge on the wire,
wherein a length of the second straight line shape is greater than a length of the first straight line shape.

8. The display apparatus of claim 1, wherein the second insulating layer covers the first insulating layer.

9. A display apparatus, comprising:
a substrate comprising a first edge, a second edge disposed opposite to the first edge, and a third edge connecting the first edge to the second edge, the substrate comprising a display area and a peripheral area outside the display area;
a wire in the peripheral area, the wire extending along at least one of the first, second, and third edges of the substrate and having an inner edge, wherein the inner edge has a first portion and a second portion, the first portion is substantially parallel to the third edge, and the second portion extends in a direction crossing the first portion and extends away from a center of the substrate;
a first insulating layer extending in a direction from the display area to the wire, wherein the first insulating layer covers the first portion of the wire and a part of the second portion of the wire, and a first end of the first insulating layer is disposed on the wire; and
a second insulating layer extending in the direction from the display area to the wire and having a second end disposed on the wire,
wherein at least one of a first distance between the first end and the second end covering the first portion of the wire or a second distance between the first end and the second end covering the second portion of the wire alternates between a first value and a second value along the first or second portions of the wire, and the first value and the second value are different from each other.

10. The display apparatus of claim 9, wherein only one of the first distance and the second distance alternates between the first value and the second value along one of the first and second portions of the wire.

11. The display apparatus of claim 10, wherein the other one of the first distance and the second distance is constant along the other one of the first and second portions of the wire.

12. The display apparatus of claim 10, wherein the second distance alternates between the first value and the second value along the second portion of the wire in the direction toward the center of the substrate.

13. The display apparatus of claim 12, wherein a third distance between the first end of the first insulating layer and the second end of the second insulating layer in an outer area of the wire is about equal to the first distance.

14. The display apparatus of claim 10, wherein a greater value between the first value and the second value is greater than the other one of the first distance and the second distance.

15. The display apparatus of claim 14, wherein a smaller value between the first value and the second value is about equal to the other one of the first distance and the second distance.

16. The display apparatus of claim 9, wherein a greater value between the first value and the second value is equal to or greater than about 5 μm.

17. The display apparatus of claim 9, wherein a greater value between the first value and the second value is equal to or greater than about 10 μm.

18. The display apparatus of claim 9, wherein
a part of the first end of the first insulating layer is bent and crosses the second portion of the wire, and has a first curvature radius, and
a part of the second end of the second insulating layer is bent and crosses the second portion of the wire, and has a second curvature radius.

19. The display apparatus of claim 9, wherein
a part of the first end of the first insulating layer is bent and crosses the second portion of the wire, and has a first straight line shape extending in a direction crossing the first edge and the third edge on the wire, and
a part of the second end of the second insulating layer is bent and crosses the second portion of the wire, and has a second straight line shape extending in the direction crossing the first edge and the third edge on the wire,
wherein a length of the second straight line shape is greater than a length of the first straight line shape.

20. The display apparatus of claim 9, wherein the second insulating layer covers the first insulating layer.

* * * * *